US010395958B2

United States Patent
Xu

(10) Patent No.: US 10,395,958 B2
(45) Date of Patent: Aug. 27, 2019

(54) METHODS FOR INSPECTION SAMPLING ON FULL PATTERNED WAFER USING MULTIPLE SCANNING ELECTRON BEAM COLUMN ARRAY

(71) Applicant: Weiwei Xu, Edgefield Plains (SG)

(72) Inventor: Weiwei Xu, Edgefield Plains (SG)

( * ) Notice: Subject to any disclaimer, the term of this patent is extended or adjusted under 35 U.S.C. 154(b) by 0 days.

(21) Appl. No.: 15/943,269

(22) Filed: Apr. 2, 2018

(65) Prior Publication Data

US 2018/0286724 A1 Oct. 4, 2018

Related U.S. Application Data

(60) Provisional application No. 62/481,045, filed on Apr. 3, 2017.

(51) Int. Cl.

| | |
|---|---|
| H01L 21/67 | (2006.01) |
| H01L 21/687 | (2006.01) |
| H01L 23/544 | (2006.01) |
| H01L 21/66 | (2006.01) |
| H01J 37/28 | (2006.01) |
| H01J 37/20 | (2006.01) |
| H01J 37/21 | (2006.01) |

(52) U.S. Cl.
CPC ........ *H01L 21/67288* (2013.01); *H01J 37/20* (2013.01); *H01J 37/21* (2013.01); *H01J 37/28* (2013.01); *H01L 21/68764* (2013.01); *H01L 22/12* (2013.01); *H01L 23/544* (2013.01); *H01J 2237/2817* (2013.01); *H01L 2223/5442* (2013.01); *H01L 2223/54406* (2013.01); *H01L 2223/54433* (2013.01)

(58) Field of Classification Search
CPC ......... H01L 21/67288; H01L 21/68764; H01L 23/544; H01L 2223/54406; H01L 2223/5442; H01L 2223/54433; H01J 37/20; H01J 37/21; H01J 37/28; H01J 2237/2817
USPC .......................... 250/306, 307, 309, 310, 311
See application file for complete search history.

(56) References Cited

U.S. PATENT DOCUMENTS

| | | | | |
|---|---|---|---|---|
| 2011/0249885 | A1* | 10/2011 | Murakawa | H01J 37/28 382/144 |
| 2011/0276935 | A1* | 11/2011 | Fouquet | G06T 7/0006 716/112 |
| 2013/0166240 | A1* | 6/2013 | Shishido | G01B 15/04 702/97 |

(Continued)

*Primary Examiner* — Nicole M Ippolito
(74) *Attorney, Agent, or Firm* — Rowan TELS LLC

(57) ABSTRACT

A method of operating a multi-column electron beam array for quality inspection of a semiconductor wafer involves dividing the whole wafer area collectively in equally divided areas allocated to each column of the array, and assigning each of the areas as a column working space having the same dimensions and orientations. The array of column working spaces are assigned to an array of column optical axes, wherein a field of view of each column is defined as a covered region in which critical wafer patterns can be scanned by one or more columns to take an image. The stage supporting the wafer is moved such that each column working space is fully covered by the field of view of each column completely. By utilizing arbitrary waveform generators in electron inspection columns, this method also can be extended to write independent arbitrary patterns in predetermined positions in each die on a wafer.

20 Claims, 17 Drawing Sheets

(56) References Cited

U.S. PATENT DOCUMENTS

2013/0234019 A1* 9/2013 Miyamoto ............ G03F 9/7003
  250/306
2017/0069080 A1* 3/2017 Sezginer ................ G06T 7/001

* cited by examiner

METHODS FOR INSPECTION SAMPLING ON FULL PATTERNED WAFER USING MULTIPLE SCANNING ELECTRON BEAM COLUMN ARRAY

CROSS REFERENCE TO RELATED APPLICATIONS

This application claims the benefit of U.S. provisional patent application Ser. No. 62/481,045, filed on Apr. 3, 2017, the contents of which are incorporated by reference herein in their entirety.

BACKGROUND

Scanning electron microscopes (SEMs) are often used in semiconductor fabrication plants to scan patterned wafers to obtain images from selected subregions that provide information on process quality. SEMs provide much better resolution than optical microscopes, because electrons have much smaller wavelength compared to optical light. However, SEMs are comparatively slow at imaging due to their sequential scanning nature. Multi-column arrays with parallel imaging capabilities improve the imaging speed of the SEMs, but even an array of 100 columns can only scan up to 1% of wafer area per hour, which is much less than what is needed by the industry. This means that sampling only selected subregions of the wafer, instead of performing a full wafer scan, becomes the practical solution. In this case the full wafer must be completely covered by the field of view of the column array so that selected areas for scanning are exposed to the electron beams. Some critical features on the wafer will not be covered if the full wafer cannot be covered by the field of view of all columns in a given time, say one hour. Therefore, an innovative method for a multi-column array is required in order to be able to reach all critical points. Because an electron beam inspection system is usually integrated with a waveform generator, it can also do pattern lithography on wafers, with proper software control.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
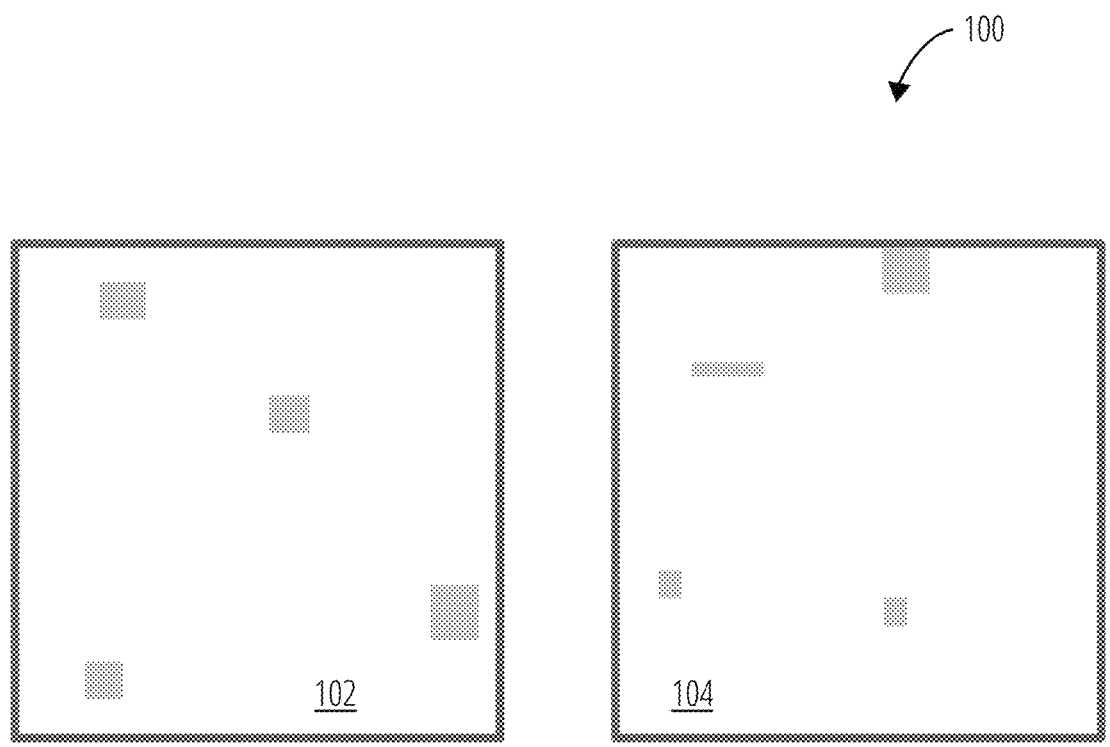
FIG. 1 illustrates different critical sites in multi-column fields of view 100 (e.g., first column field of view 102 and second column field of view 104) in accordance with one embodiment.

A method is herein disclosed to enable a multi-column array to cover the whole wafer area collectively in equally divided areas allocated to each column. Each of these areas is defined as a column working space. Each column working space has the same dimensions and orientations. The array of column working spaces is aligned to the array of column optical axes. FIG. 1 illustrates different critical sites in multi-column fields of view 100 (e.g., first column field of view 102 and second column field of view 104) in accordance with one embodiment.

The field of view of each column is defined as a covered region. A covered region is one in which critical wafer patterns can be scanned by one or more columns to take an image. By moving the stage supporting the wafer, each column working space can be fully covered by the field of view of each column completely. All critical sites inside the working space can be scanned and imaged while non critical patterns are ignored.

The working space of each column may be divided into multiple line sections. The stage is moved in a continuous motion to scan a line section of the working space. Critical sites are scanned and imaged once they move inside the covered region of the column array. As the stage moves across all the line sections of the working space, the whole wafer is covered by the field of view of the column array, and all critical sites may be selectively scanned. Because all working spaces are equally spaced with same dimensions and orientations, when one working space is fully scanned, all others are also fully scanned. The position and dimension of critical sites in different working spaces can be independently decided by an algorithm that accounts for lithography conditions and critical features in the patterning database.

Figure 2:
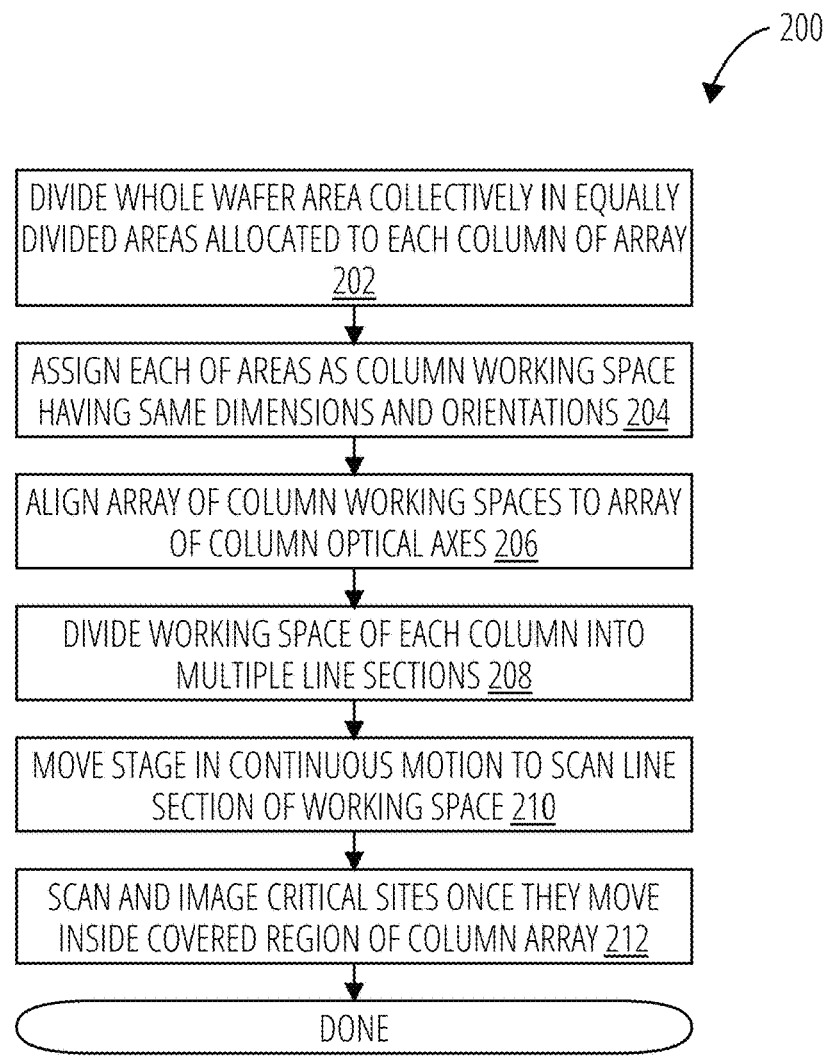
FIG. 2 illustrates a wafer inspection process 200 in accordance with one embodiment.
Figure 3:
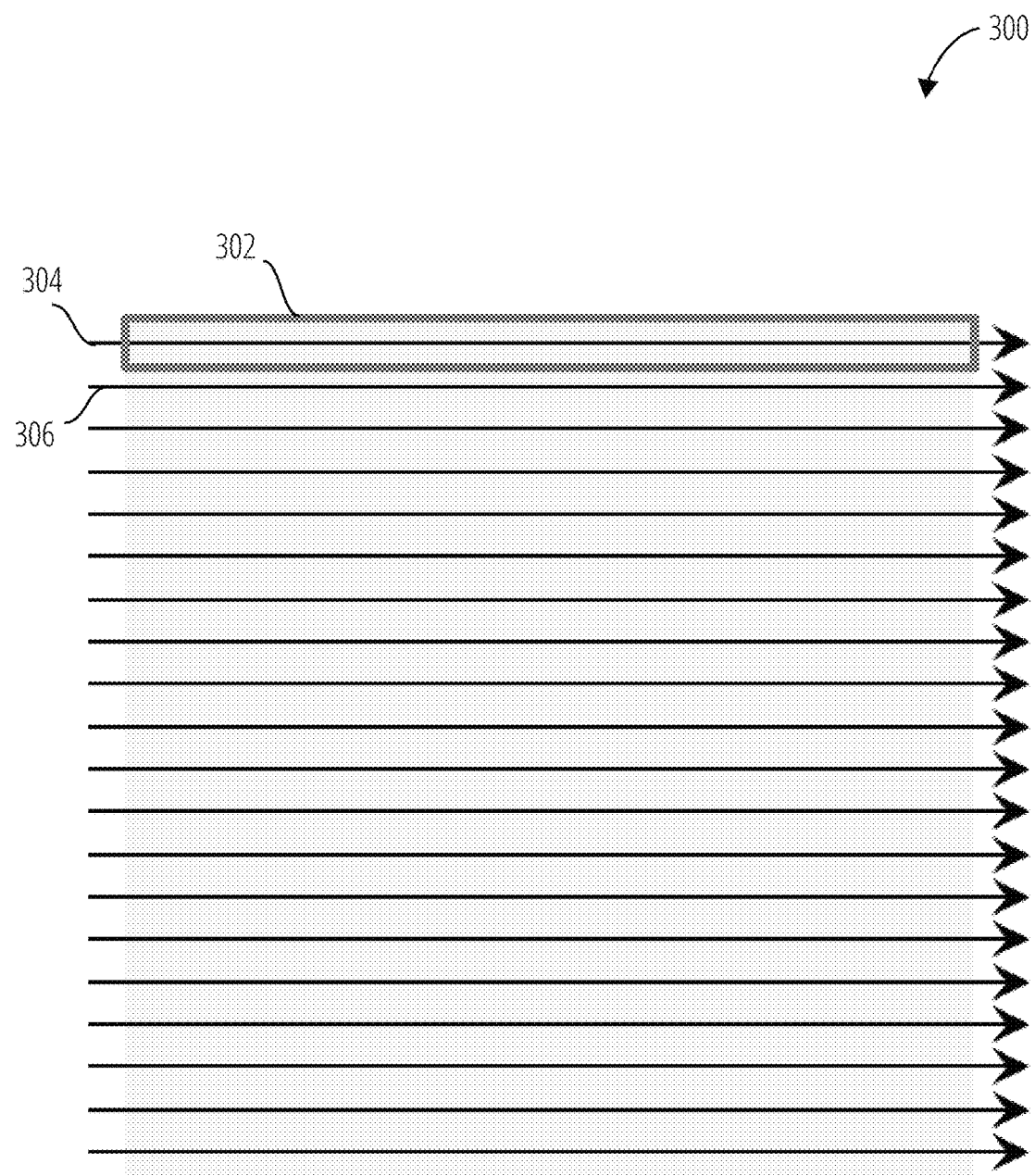
FIG. 3 illustrates an array-line-scan 300 in accordance with one embodiment.
Figure 4:
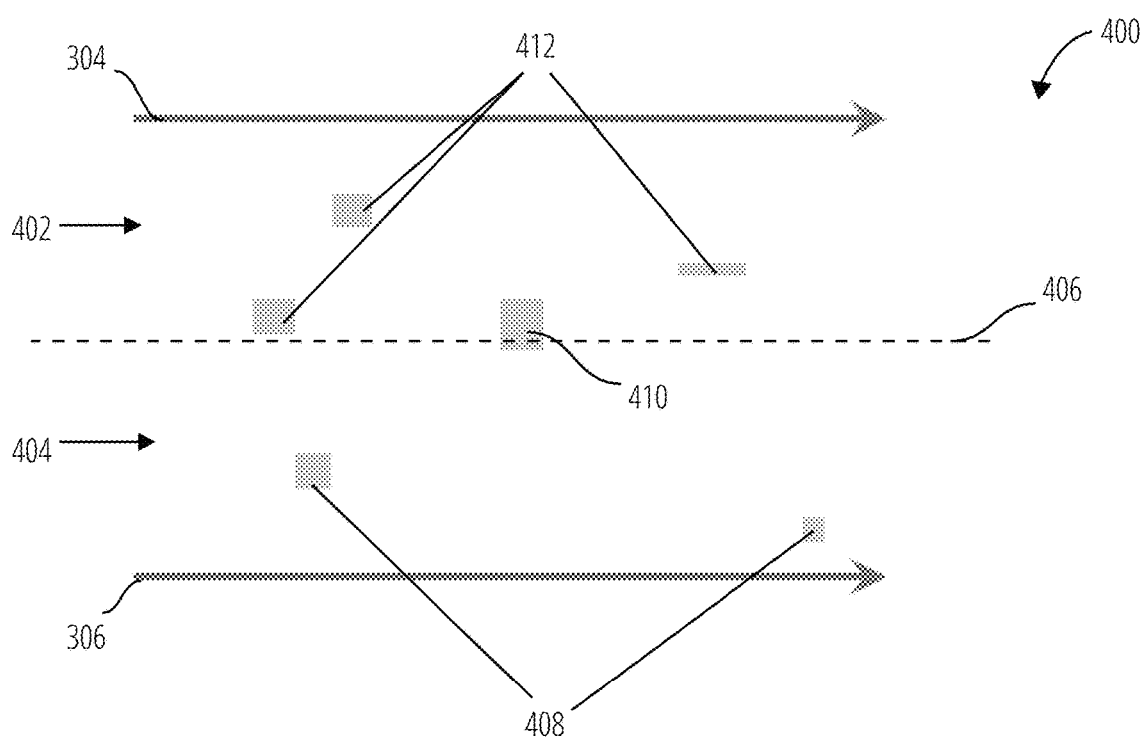
FIG. 4 illustrates critical sites 400 for beam column inspection in accordance with one embodiment.

Referring to the wafer inspection process 200 in FIG. 2, at block 202 first divide the whole wafer area collectively in equally divided areas allocated to each column of the array. FIG. 3 illustrates the column paths in an array-line-scan mode. Each column working space is divided into line sections (e.g., scan line 304, scan line 306) each having a width the same as the column field of view 302 and a length the same as the column pitch. As the stage is moved along the scan line 304, the scan positions on the wafer are determined by measuring stage coordinates and wafer coordinates of critical sites. Instead of scanning the whole field of view (e.g., field of view 402 for scan line 304, field of view 404 for scan line 306), small sampling sites are scanned for imaging purposes. Beam conditions are set independently for different sites and for different columns. Scanned imaging sizes are also set independently for different sites and for different columns. Imaging processing modes may also be different for different imaging sites. In array-line-scan mode, only critical sites inside the field of view of each column (e.g., critical sites 412 for the column on scan line 304 and critical sites 408 for the same column on scan line 306, and critical site 410 for both scan lines) are selected to be scanned. These sites can have different beam conditions, different image sizes, different shape, and different pixel sizes.

Thus the wafer inspection process 200 assigns each of the areas as a column working space having the same dimensions and orientations (block 204) and aligns the array of column working spaces to an array of column optical axes (block 206). The working space of each column is divided into multiple line sections (block 208) and the stage is moved in a continuous motion to scan a line section of the working space (block 210). Critical sites are scanned and imaged once they move inside the covered region of the column array (block 212).

The working space may be divided into squares. Each square may approximate the size of the field of view of the column or covered region. The stage is skipped from one covered region to another covered region, until all covered regions of a working space are visited. After each stage move, there may be an auto focusing calibration to optimize the imaging beam conditions and to correct image position errors arising from stage motion errors. This makes it possible to utilize smaller image and less time to scan the critical sites. Between each stage move, all critical sites in the covered region of all columns are scanned to form images. The dwelling time for imaging between each stage move from a covered region to another may vary depending on application demands. If there are more than average critical sites inside one particular covered region, the stage is held in position while images are taken for longer before the next move. On the other hand, if there are fewer than average critical sites inside one particular covered region, the stage may be held for less time before the next move.

Figure 5:
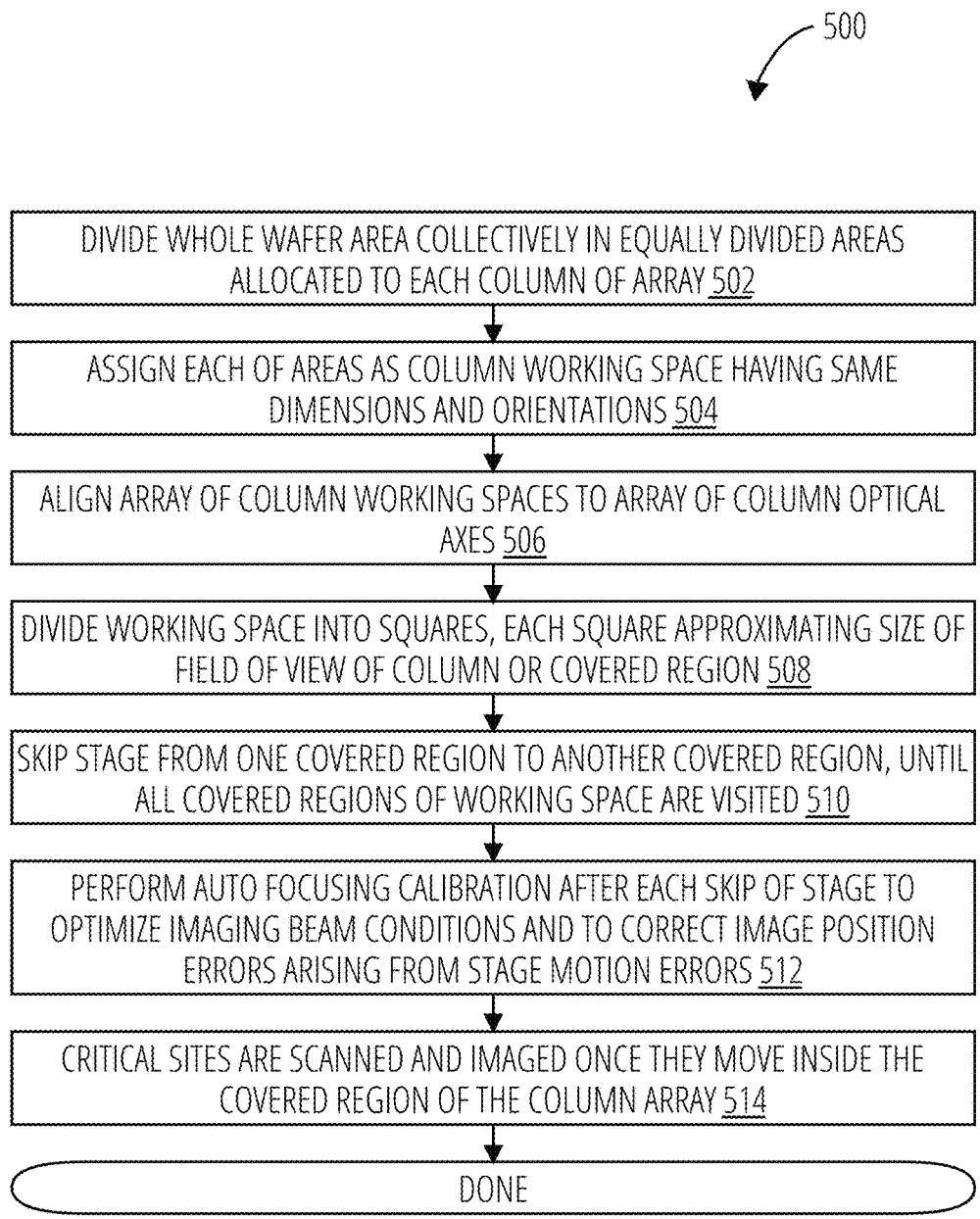
FIG. 5 illustrates a wafer inspection process 500 in accordance with one embodiment.
Figure 6:
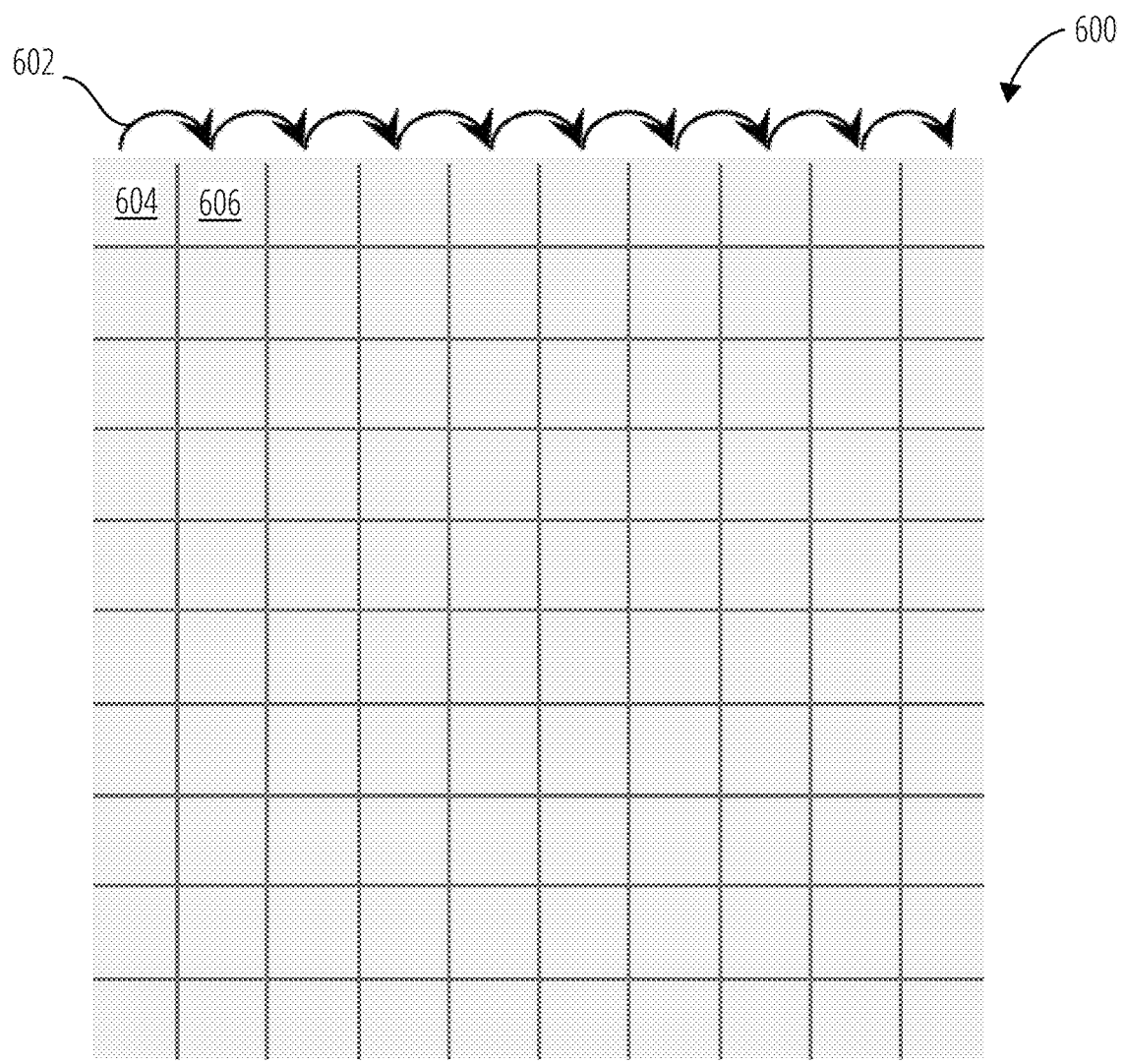
FIG. 6 illustrates an array-leap-scan 600 in accordance with one embodiment.
Figure 7:
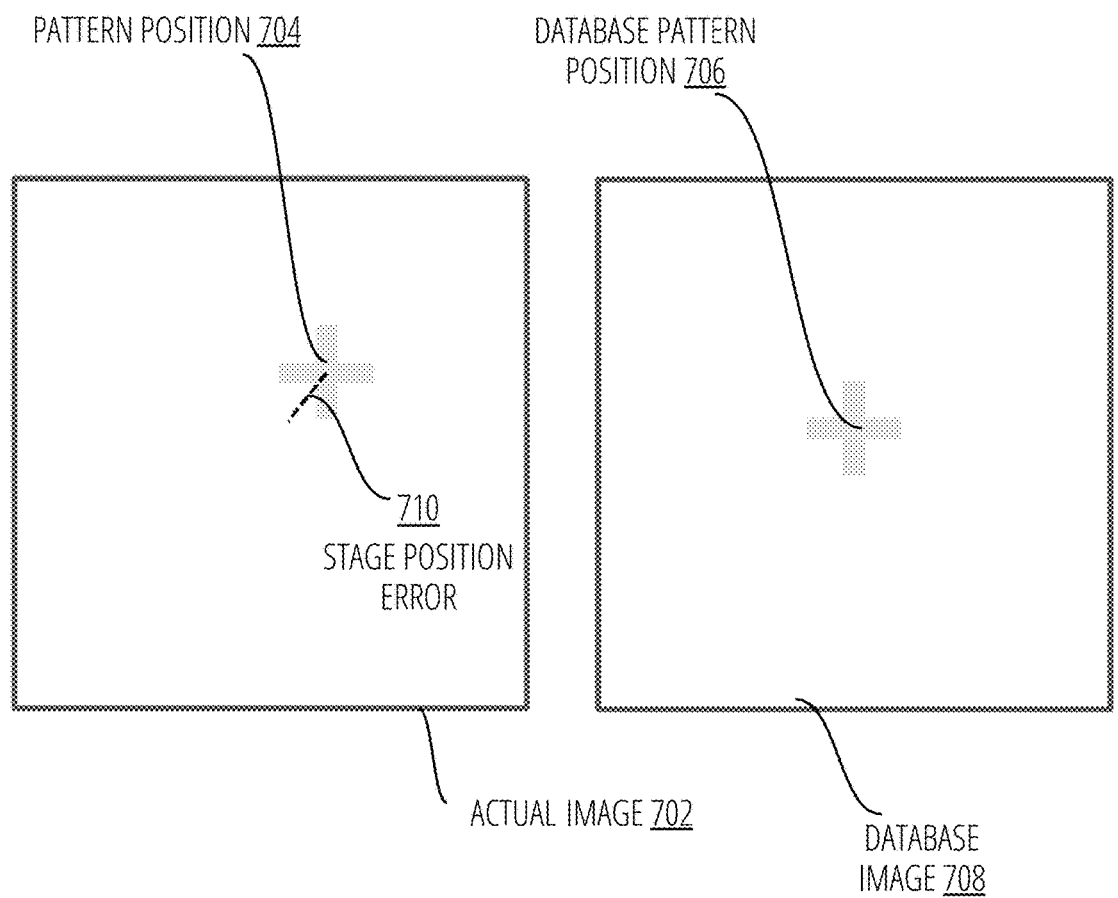
FIG. 7 illustrates the use of autofocus between stage moves to compensate for stage position errors, in accordance with one embodiment.
Figure 8:
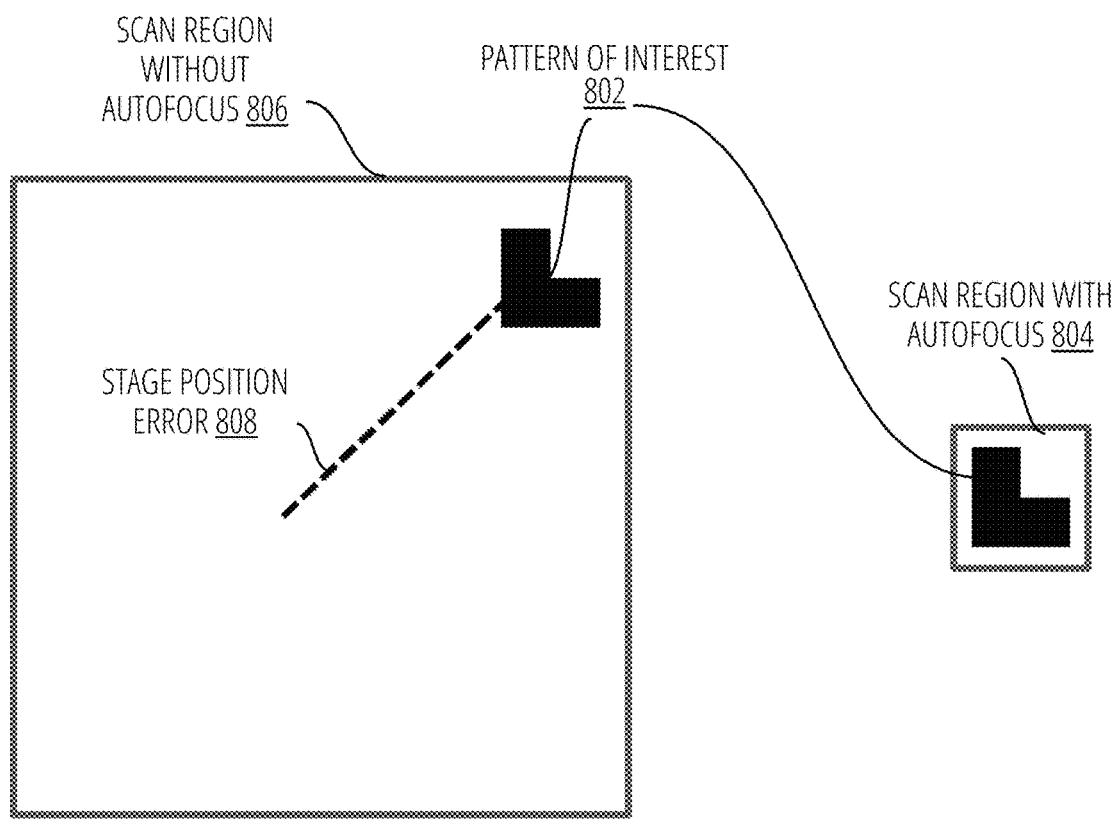
FIG. 8 illustrates the effects of autofocus on reducing imaging area, in accordance with one embodiment.

Referring to the wafer inspection process 500 in FIG. 5, at block 502, first divide the whole wafer area collectively in equally divided areas allocated to each column of the array. At block 504, assign each of the areas as a column working space having the same dimensions and orientations. At block 506, align the array of column working spaces to an array of column optical axes. At block 508, divide the working space into squares, each square approximating a size of the field of view of the column or covered region. At block 510, skip the stage from one covered region to another covered region, until all covered regions of a working space are visited. At block 512, perform an auto focusing calibration after each skip of the stage to optimize imaging beam conditions and to correct image position errors arising from stage motion errors. At block 514, critical sites are scanned and imaged once they move inside the covered region of the column array.

As the stage is moved repeatedly in a skip movement 602, the first column moves from imaging area 604 to imaging area 606.

Electron beam conditions may be dynamically modified during the dwelling time between stage moves. For example, highly repeatable, CDSEM type beams may be used to measure pattern shifting and pattern shrinking. For another example, high beam current inspection beams can be used to cover a larger area, and high resolution review type beams may be used to double check the imaged sites, which are suspected for defects. As yet another example, high resolution review type beams may be used to check whether the pattern at a small, weak process site is patterned within the process window.

All sites scanned in a covered region may each be independently defined. The size of the image, in terms of pixel numbers, can be different for different sites. The pixel size can be different for different sites. The number of frame averaging, dot averaging, and line averaging can be independently defined for each site. Different beam conditions can be used on different sites.

The disclosed scanning system has numerous advantages over conventional wafer scanners. The full wafer area is covered by the combined field of view of all columns during stage movement. This allows any site on the wafer to be selected for sampling purposes. A multicolumn array of, for example, 100 columns has potentially 100 times higher throughput than a single column system. The larger field of view of each column reduces the number of stage moves needed to cover the whole wafer area. Columns are each all independently configurable for imaging beam conditions, electrostatic deflection of scanning area within the field of view, and imaging process. Each column has an independent and synchronized set of waveform scan generators, beam position deflection signal generators, detectors, amplifiers, and detector signal digitizers, to create synchronized scanning signals for imaging processing purposes. This allows fully independent scanning, position switching, and imaging control of each column. Waveforms of the scanning signal may be segmented for each small imaging site, and the waveforms streamed in a first-in-first-out (FIFO) manner to the arbitrary waveform generators (AWGs). This enables the collection of scanning waveform data, which can exceed the AWG on-board memory, to be processed in a sequential manner.

Detector signal digitizers may work in stream mode to computers for imaging processes in a first-in-first-out manner. This enables imaging data, which typically exceeds the capacity of digitizer on-board memory, to be processed in a sequential FIFO. This also enables detector signal collection, data transfer, and image processing to be carried out in parallel to improve overall system performance. Digitizers may be implemented using FPGAs or other programmable devices, including on-board image processing (for example, dot average, line average, frame average of imaging data) to reduce the required data rate for streaming.

In array line-scan mode, the stage is moved continuously while the covered regions of the columns array scan through the whole wafer and selectively take images inside the covered regions. In an array line-scan action, each column covers an area having the width of the column field of view and length of the column array pitch. Multiple lines-scan actions cover the full column working space and the full wafer is covered by the field of view of the multi-column array. Only critical sites are selected to scan for imaging purposes, in a sampling mode, to ensure the critical sites are imaged during the limited wafer process qualification time window.

In line-scan mode, each column may scan independently at its own configured coordinates of sites. Images from critical sites may be generated for each column with distinct settings for coordinates, number of imaging pixels, pixel size, image shape, number of frame signal averaging, number of dot signal averaging, and number of line signal averaging.

The stage can also skip from one covered region to another covered region in leap-scan mode. Each covered region may perform auto focusing to correct focusing and positioning errors. Autofocus can be used to compensate for a stage position error 710 that causes a pattern position 704 in the actual image 702 to misalign from a database pattern position 706 in the database image 708. Imaging time between each stage leap may be distinctly controlled to optimize imaging time and for autofocus. Without autofocus between stage moves, a large scan area is needed to include the pattern of interest inside the field of view with unknown and uncorrected stage position errors. Small scan area is possible to include only the pattern of interest inside the field of view with corrected stage position errors. Thus for example a pattern 802 can experience a large offset in a scan region without autofocus 806 due to a stage position error 808, but a scan region with autofocus 804 can be drawn much tighter around the pattern 802.

In line-scan mode, each column may scan independently at its own configured coordinates of sites. Images from critical sites may be generated from each column with distinct settings for coordinates, number of imaging pixels, pixel size, image shape, number of frame signal averaging, number of dot signal averaging, and number of line signal averaging on a per-column basis.

The stage can skip from one covered region to another covered region in leap-scan mode. Each covered region may perform auto focusing to correct focusing and positioning errors. Imaging time between each stage leap may be distinctly controlled to optimize imaging time. Auto focusing may be carried out after a move to each covered region, in order to optimize beam conditions and to correct imaging position errors. The dwelling time between stage-leaps can be independently set based on the amount of imaging workload configured in that particular covered region. Each column is given same period of time for imaging after each stage move. Each column may independently decide how to use this imaging time to scan the most critical imaging sites inside their current covered region. Each column may independently use different beam conditions for imaging at different sites. If some columns detect suspected failure or defects in low or regular resolution mode, the column may switch to high resolution imaging, for defect verification.

The entire wafer to be inspected may be collectively covered by the combined field of views of the multi-column array, either in array line scan mode or array leap scan mode. The overall field of view is much larger than a single beam system. Imaging throughput is greatly increased because stage movement time, which does not directly contribute to faster imaging, is reduced. For example, if it takes 1000 stage moves to cover the full wafer using a multi-column array of 100 columns, it will take 100,000 stage moves to cover the full wafer using a single column system with the same field of view as a single column of the multi-column array.

The stage may be moved in array-line-scan mode, so that the stage movement and the imaging process can work in parallel, and non-imaging time is reduced. Alternatively, the stage may be moved in array-leap-scan mode, so that auto-focusing may be carried out after each stage movement settles, and beam condition can be optimized and position errors can be corrected to allow small image sizes that focus in on critical points on the wafer. Smaller image sizes require less time to obtain the image and thus more images of critical points may be scanned between stage moves.

Figure 9:
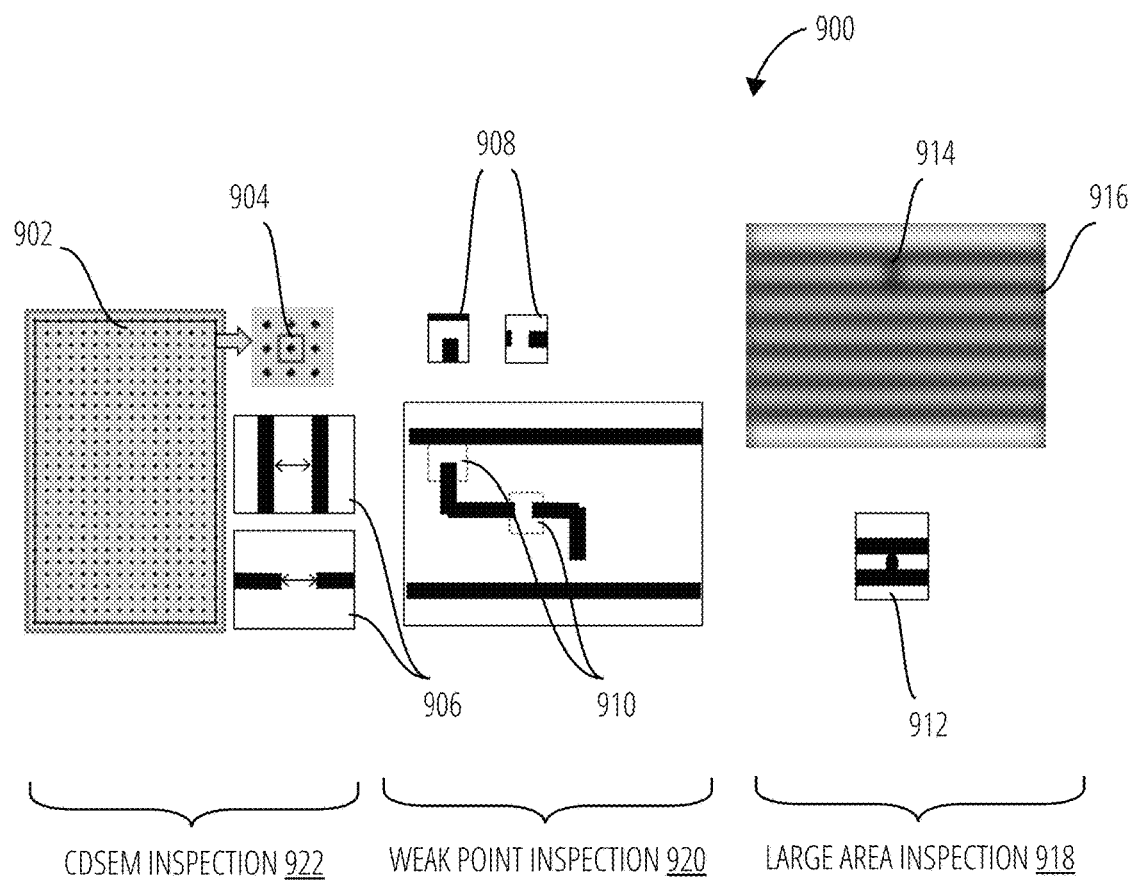
FIG. 9 illustrates column-variable imaging 900 in accordance with one embodiment.

Independent beam condition control enables the configuration of different scan properties per column, and optimized information collection in different imaging modes. For example, FIG. 9 illustrates example work load allocation of a column inside one covered region with 25% work load allocated for dense CDSEM measurement, 25% work load allocated for review SEM mode weak point control, and 50% work load allocated for large area inspection and review purposes. CDSEM measurement is used for example to inspect line spacing, distance between line ends, or other measurement applications.

A CDSEM inspection 922 may be performed on dense CDSEM measurement sites 902 (e.g., site 904) to yield measurement results 906. A weak point inspection 920 may be performed on sampling sites 910 in the same covered region, yielding image review results 908. A large area inspection 918 may also be performed on a potential defect 914 in the inspection region 916, yielding yet more inspection results 912.

The imaging beam conditions may be dynamically switched rapidly using electrostatic column controls. During each stage leap, during the dwelling time for imaging, the work load in different imaging mode can be determined by either lithography process parameters or patterning information. Imaging time may be allocated among CDSEM mode, review SEM mode, and inspection SEM mode.

Figure 10:
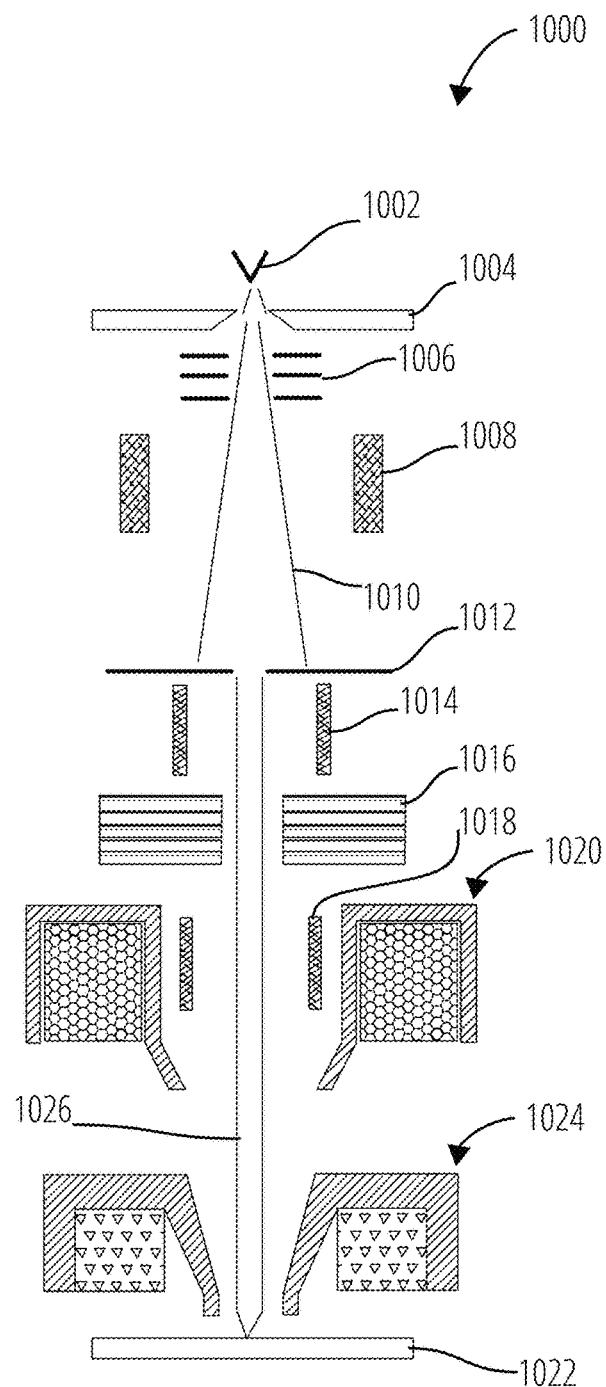
FIG. 10 illustrates an electron beam column 1000 with no pre-sample beam cross over to reduce electron-electron column interaction in accordance with one embodiment.

FIG. 10 illustrates an electron beam column 1000 with no pre-sample electron beam 1026 cross over to reduce electron-electron column interaction in accordance with one embodiment. The electron beam column 1000 comprises an electron source 1002, a beam defining aperture 1004, a gun lens 1006, a beam blanker 1008, an electron beam 1010, a beam current limiting aperture 1012, an upper scanning deflector 1014, an electron detector 1016, a coil driven adjustment lens 1020, a lower scanning deflector 1018, a permanent magnet driven objective lens 1024 and a wafer 1022.

The operation of the electron beam column 1000 will be readily apparent to those of ordinary skill the art.

Figure 11:
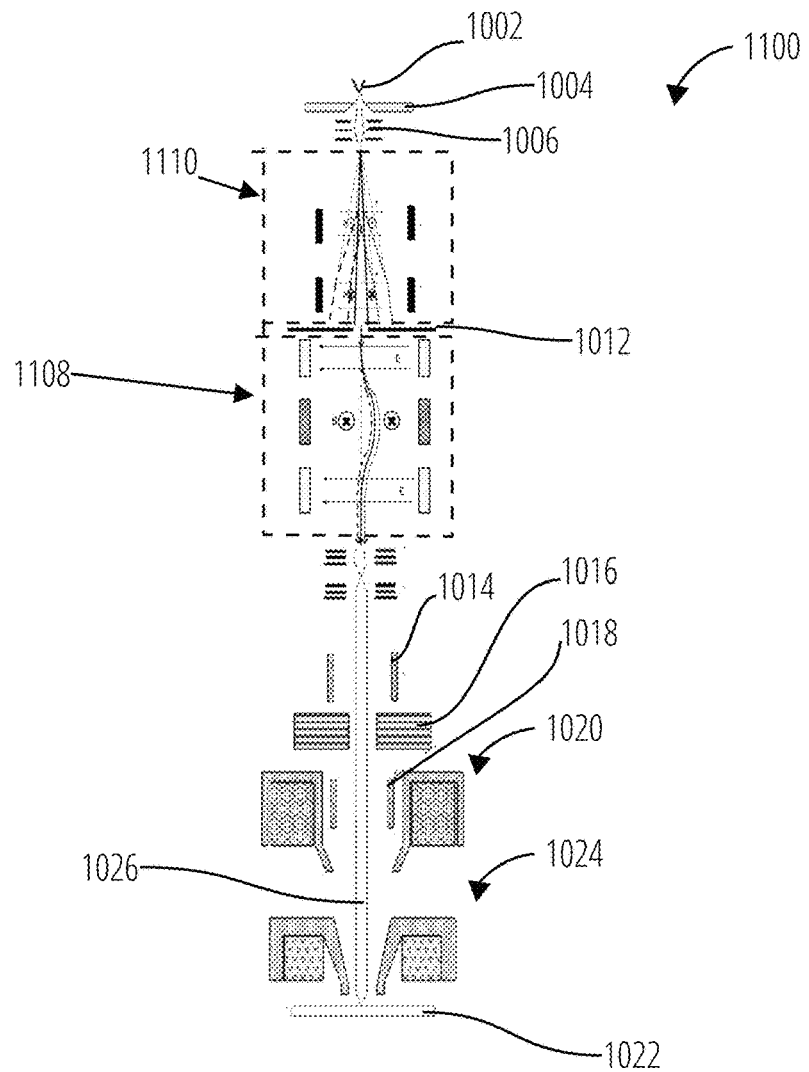
FIG. 11 illustrates an electron beam column 1100 including the double Wein filter monochromator (double Wein filter 1110, dispersion corrector 1108) and a dispersion error corrector using two 2D electrostatic deflectors 1202 and one 2D magnetic deflector 1206.

FIG. 11 illustrates an electron beam column 1100 including the double Wein filter monochromator (double Wein filter 1110, dispersion corrector 1108) and a dispersion error corrector using two 2D electrostatic deflectors and one 2D magnetic deflector.

Figure 12:
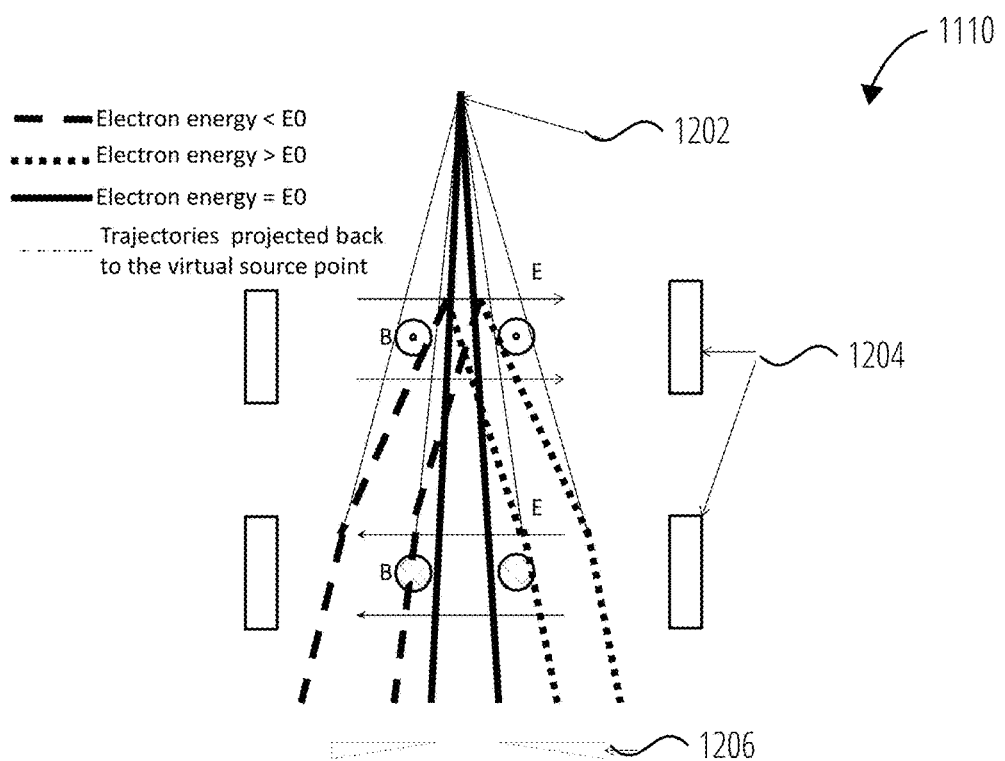
FIG. 12 illustrates a double Wein filter 1110 combination will correct the primary electron energy related focused position shifts of the first Wien filter on the focusing plane.

Referring to FIG. 12, in a double Wein filter 1110 combination, electrons emanate from an electron virtual source point 1202, and through an electrostatic deflector 1204 to a final beam-forming aperture 1206.

FIG. 12 illustrates a double Wein filter 1110 combination will correct the primary electron energy related focused position shifts of the first Wien filter on the focusing plane. A double Wein filter 1110 before the final beam-forming-aperture setup will provide energy filtering while keeping virtual sources of electrons with different energies at the same virtual source point.

Figure 13:
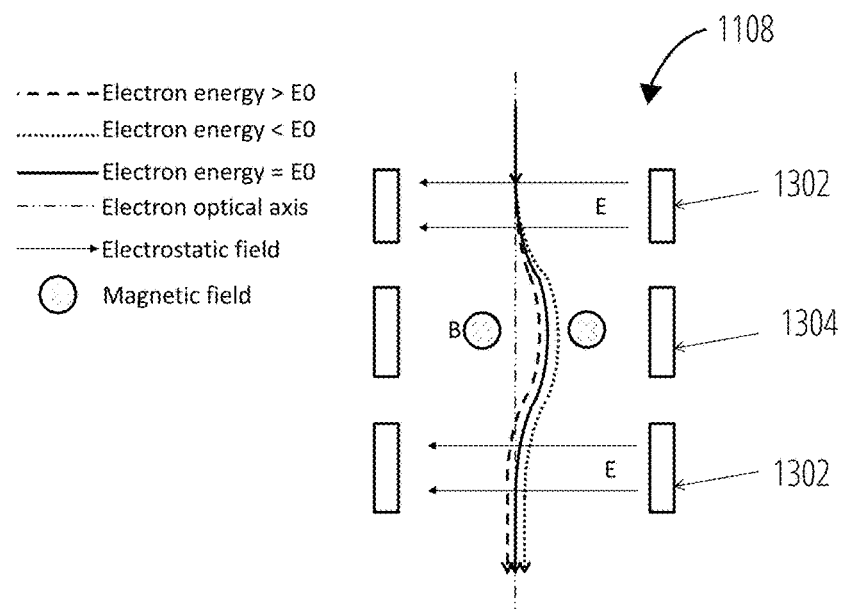
FIG. 13 illustrates a dispersion corrector 1108 of two 2D electrostatic deflectors and one 2D magnetic deflector to correct electron beam dispersion on the sample plane, which may be caused by Wien Filters or an objective lens field in large field of view scanning mode. The electron beam is finally deflected back to the original direction and position of primary electron optical axis.

FIG. 13 illustrates a dispersion corrector 1108 of two 2D electrostatic deflectors 1302 and one 2D magnetic deflector 1304 to correct electron beam dispersion on the sample plane, which may be caused by Wien Filters or an objective lens field in large field of view scanning mode. The electron beam is finally deflected back to the original direction and position of primary electron optical axis.

A setup with one magnetic deflector 1304 in between two electrostatic deflectors 1302 can introduce a dispersion effect, while bring back the electron beam trajectories back to optical axis. This dispersion effect is calculated so that it will cancel the dispersion of electron beam scanning for a certain field of view.

An Internet of Things (IoT) device is any nonstandard computing device that connects wirelessly to a network and has the ability to transmit data. IoT devices include thermostats, light bulbs, door locks, fridges and etc. The concept of IoTs is all these things working in concert for people in business, in industry, or at home. However, IoT devices are vulnerable to hacker's attack. Hackers may exploit defects to breach software defenses through internet connections. Thus, IoT devices is advised to have both hardware and software security. Software security is enhanced by software updates. Hardware security systems authenticate software updates. Chip embedded security is the key of hardware security system. In a chip embedded security system, security keys are written directly at predetermined sites on wafers. The security keys can be anything from MAC addresses, chip identification codes to private keys to secure software authentication. The security keys are readable, but cannot be altered.

Figure 14:
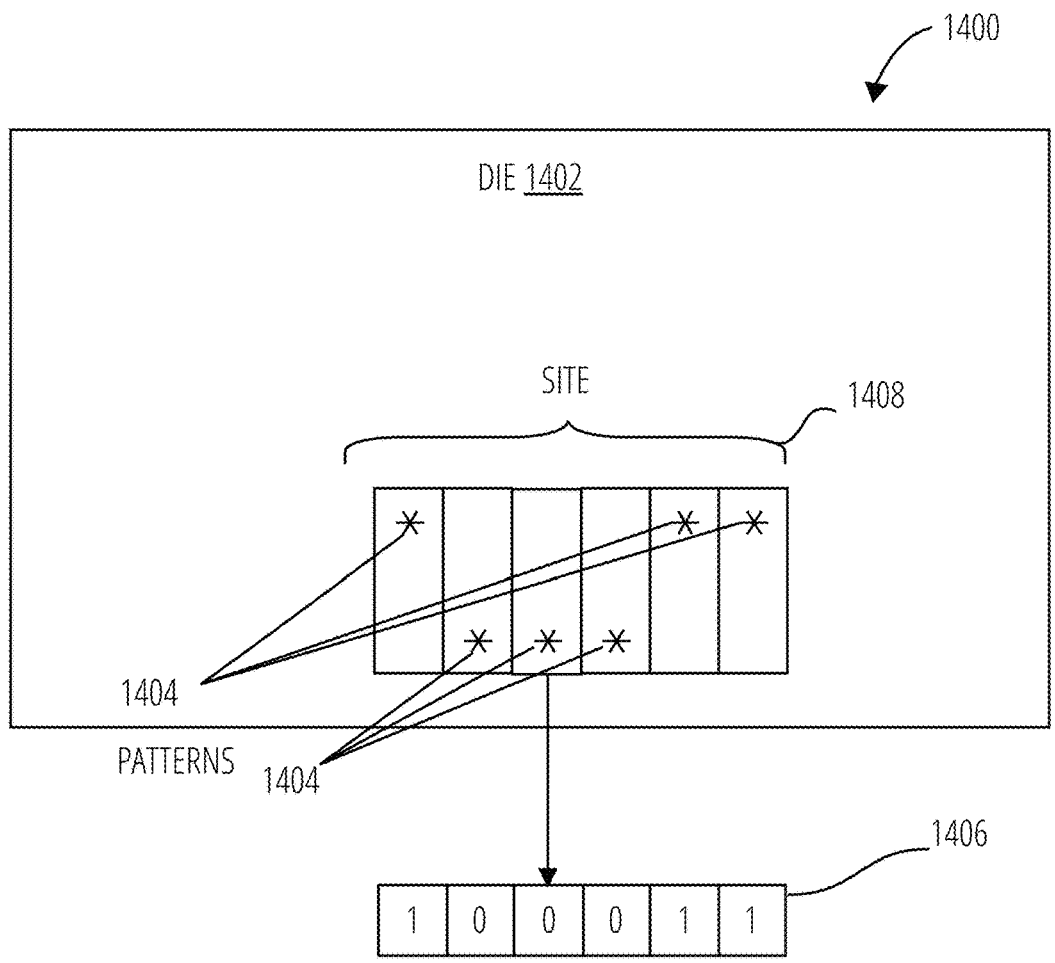
FIG. 14 illustrates an example of chip embedded security system.

FIG. 14 illustrates an example of chip embedded security system using a multi beam writing system to write security keys directly on wafers. An electron beam is used to write customized patterns 1404 at a predetermined site 1408 within a die 1402 on a wafer. For example, embedded code 1406 can be written at a predetermined site 1408 to indicate a security key 100011. Different electron columns of a multi beam system can write independently at different predetermined sites. Different patterns or security keys can be written at different predetermined sites, on different dies, or on different wafers. Additionally, security keys or different patterns can be written at a predetermined site as part of the integrated circuits. For example, a line can be written at a predetermined site to form an electric connection between two electrodes.

Figure 15:
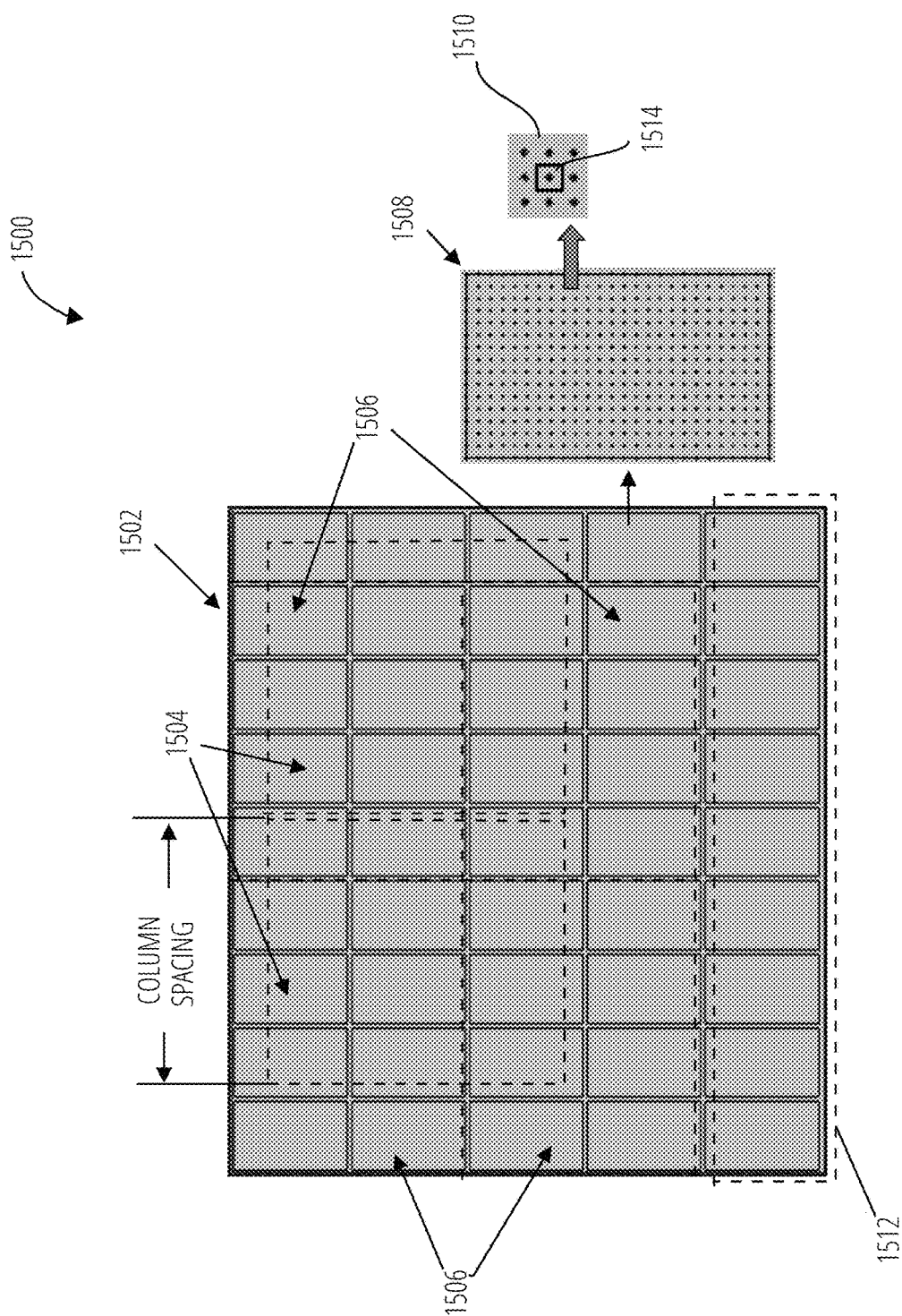
FIG. 15 illustrates inspecting one test feature within a finite area in vicinity.

FIG. 15 illustrates inspecting one test feature within a finite area in vicinity. A wafer 1502 is equally divided into 5×9 dies 1512. Each die 1512 is equally divided into a number of wafer pattern arrays 1508. Each wafer pattern array 1508 contains a number of finite areas 1510. Each finite area 1510 contains at least one critical wafer pattern 1514. The sizes of column spacing 1504 and lithography mask 1506 are multiplications of the size of finite areas 1510. As illustrated in FIG. 15, four identical photo lithography masks 1506 are aligned with dies 1512. Two equally spaced electron beam columns 1504 are aligned with the dies 1512. Generally, all the dies 1512 are designed to have the same or similar critical wafer patterns 1514 and spacing. Aligning one electron beam 1010 of one electron beam column 1000 to one critical wafer pattern 1514 in a finite area 1510 automatically aligns the other electron beams of the multi column electron beam array to the same or similar critical wafer patterns 1514 in different finite areas.

Figure 16:
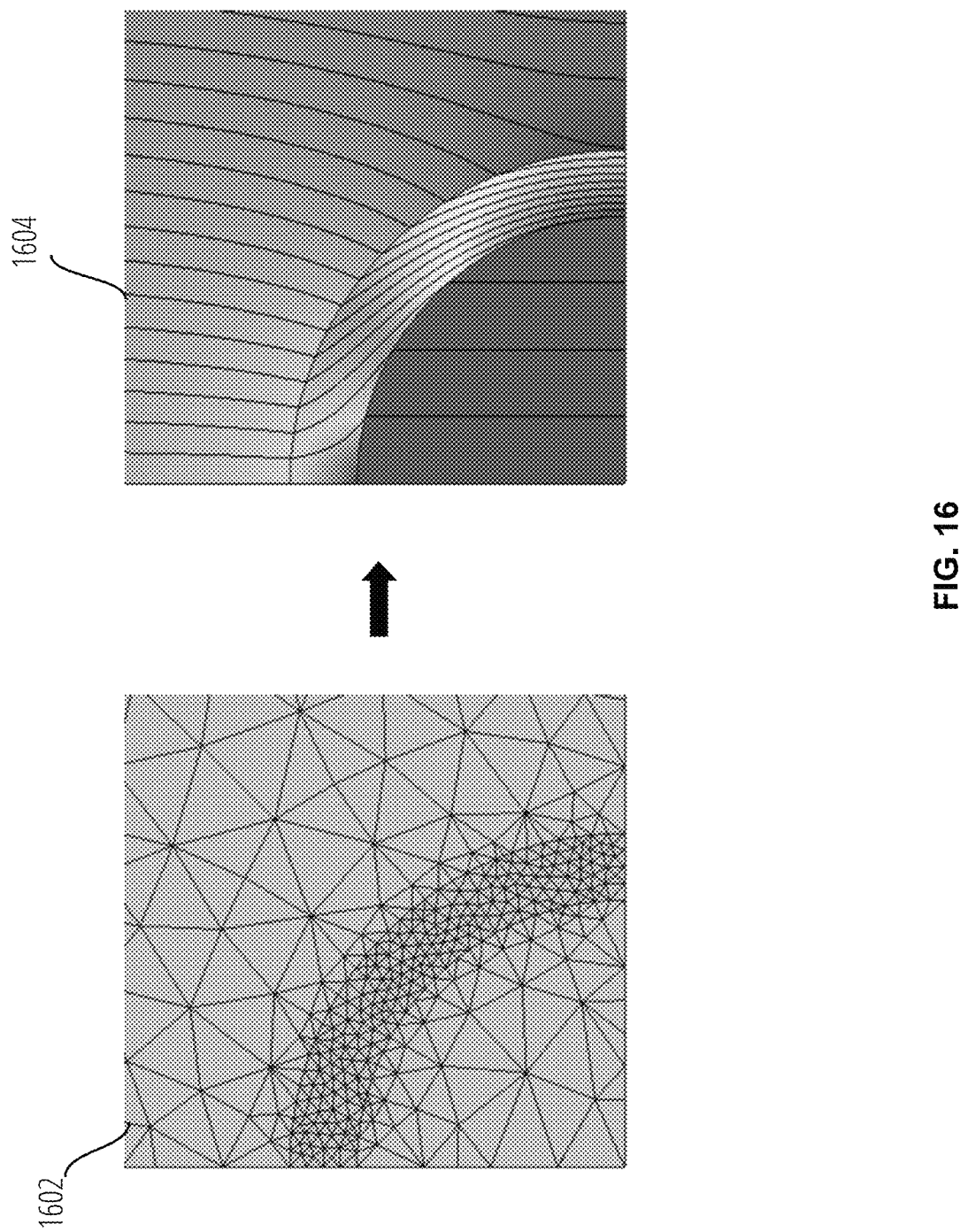
FIG. 16 illustrates 2-dimensional integration of test results of a number of finite areas.

FIG. 16 illustrates a 2-dimensional integration of test results of a number of finite areas. The left image 1602 shows 2-dimensional testing point distribution map that contains a number of connected dots. Each dot is a testing point of a finite area. Some critical locations have more testing points, while less critical locations have fewer testing points. Image 1602 shows there are more testing points around a quarter ring structure. The right image 1604 shows a converted image with all the testing points data displayed on the 2-dimensional map.

Figure 17:
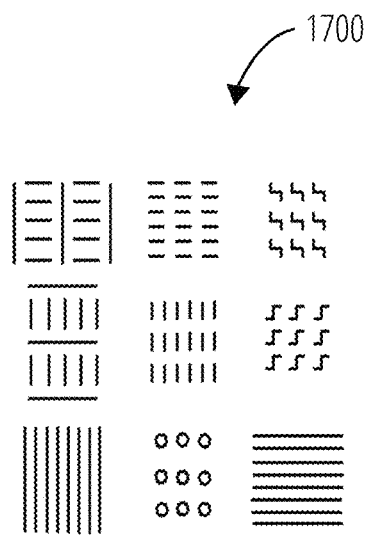
FIG. 17 illustrates an example of 9 critical patterns in one finite area.

FIG. 17 illustrates an example of 9 critical patterns in the center of a finite area 1510. Aligning dies to multi electron beam columns is flexible when each die contains the same critical patterns at the same relative location and the column spacing is the multiples of the finite areas 1510. For example, when one electron beam column is aligned to a critical pattern of a finite area in one die, the rest of the electron beam columns of the multi-column system will all be aligned to the same critical pattern of other finite areas in different dies.

What is claimed is:

1. A method of operating a multi-column electron beam array, the method comprising:
   dividing a whole wafer area collectively in equally divided areas allocated to each column of the array;
   assigning each of the areas as a column working space having the same dimensions and orientations;
   aligning the array of column working spaces to an array of column optical axes;
   wherein a field of view of each column is defined as a covered region in which critical wafer patterns can be scanned by one column to take an image;
   moving the stage supporting the wafer such that each column working space is fully covered by the field of view of each column completely;
   scanning and imaging all critical sites inside the working space while ignoring non-critical patterns; and
   wherein a position and dimension of critical sites in different working spaces is independently determined by an algorithm that accounts for lithography conditions and critical features in the patterning database.

2. The method of claim 1, further comprising:
   dividing the working space of each column into multiple line sections;
   moving the stage in a continuous motion to scan a line section of the working space; and
   scanning and imaging critical sites once they move inside the covered region of the column array.

3. The method of claim 1, further comprising:
   dividing the working space into rectangles or squares, each rectangle or square approximating a size of the field of view of the column or covered region;
   skipping the stage from one covered region to another covered region, until all covered regions of a working space are visited; and
   performing an auto focusing calibration after each skip of the stage to optimize imaging beam conditions and to correct image position errors arising from stage positioning errors.

4. The method of claim 3, further comprising:
   scanning all critical sites in the covered region of all columns to form images before each stage move; and
   setting a dwelling time for imaging between each stage move from a covered region to another to vary depending on the particular imaging demands of the current covered region.

5. The method of claim 1, further comprising:
   dynamically modifying electron beam conditions during the dwelling time between stage moves.

6. The method of claim 5, further comprising:
   independently defining all sites scanned in a covered region, according to one or more of a size of the image, a number of pixels, a pixel size, a number of frames to average, dot averaging, line averaging, and beam conditions.

7. The method of claim 1, further comprising:
writing customized patterns in predetermined sites using electron beams.

8. The method of claim 7, wherein the customized patterns are different in different predetermined sites.

9. The method of claim 1, further comprising:
dividing each equally divided area into equally divided arrays;
dividing each equally divided array into equally divided finite areas wherein each equally divided finite area contains a critical wafer patterns; and
aligning one critical wafer pattern to one array of column optical axe.

10. The method of claim 9, further comprising:
inspecting one critical wafer pattern;
determining whether each equally divided finite area can pass a first criterion based on an inspection result of the one critical wafer pattern contained within the equally divided finite area; and
determining whether the whole wafer area can pass a second criterion by integrating all the inspection results of critical wafer patterns.

11. The scanning device of claim 10, further comprising:
the wafer scanning system capable of writing customized patterns in the predetermined critical sites using electron beams.

12. The scanning device of claim 11, wherein the customized patterns are different in different critical sites.

13. A scanning device of multi-column electron beam arrays, comprising:
a wafer division system capable of dividing a whole wafer area collectively in equally divided areas allocated to each column of the array;
a wafer mapping system capable of assigning each of the areas as a column working space having the same dimensions and orientations;
a wafer aligning system capable of aligning the array of column working spaces to an array of column optical axes;
wherein a field of view of each column is defined as a covered region in which critical wafer patterns can be scanned by one column to take an image;
a wafer moving system capable of moving the stage supporting the wafer such that each column working space is fully covered by the field of view of each column completely;
a wafer scanning system capable of scanning and imaging all critical sites inside the working spacing while ignoring non-critical patterns; and
wherein a position and dimension of critical sites in different working spaces is independently determined by an algorithm that accounts for lithography conditions and critical features in the patterning database.

14. The scanning device of claim 13, further comprising:
the wafer division system capable of dividing the working space of each column into multiple line sections;
the wafer moving system capable of moving the stage in a continuous motion to scan a line section of the working space; and
the wafer scanning system capable of scanning and imaging critical sites once they move inside the covered region of the column array.

15. The scanning device of claim 13, further comprising:
the wafer division system capable of dividing the working space into rectangles or squares, each rectangle or square approximating a size of the field of view of the column or covered region;
the wafer moving system capable of skipping the stage from one covered region to another covered region, until all covered regions of a working space are visited; and
the wafer scanning system capable of performing an auto focusing calibration after each skip of the stage to optimize imaging beam conditions and to correct image position errors arising from stage motion errors.

16. The scanning device of claim 15, further comprising:
the wafer scanning system capable of scanning all critical sites in the covered region of all columns to form images before each stage move; and
the wafer moving capable of setting a dwelling time for imaging between each stage move from a covered region to another to vary depending on the particular imaging demands of the current covered region.

17. The scanning device of claim 13, further comprising:
the wafer scanning system capable of dynamically modifying electron beam conditions during the dwelling time between stage moves.

18. The scanning device of claim 17, further comprising:
the wafer scanning system capable of independently defining all sites scanned in a covered region, according to one or more of a size of the image, a number of pixels, a pixel size, a number of frames to average, dot averaging, line averaging, and beam conditions.

19. The scanning device of claim 13, further comprising:
the wafer division system capable of dividing each equally divided area into equally divided arrays;
the wafer division system capable of dividing each equally divided array into equally divided finite areas wherein the equally divided finite area contains one critical wafer patterns; and
the wafer scanning system capable of aligning one critical wafer pattern to one array of column optical axe.

20. The scanning device of claim 19, further comprising:
the wafer scanning system capable of inspecting the one critical wafer pattern;
the wafer scanning system capable of determining whether each equally divided finite area can pass a first criterion based on an inspection result of the one critical wafer pattern contained within the equally divided finite area; and
the wafer scanning system capable of determining whether the whole wafer area can pass a second criterion by integrating all the inspection results of critical wafer patterns.

* * * * *